United States Patent
Fisk et al.

(10) Patent No.: US 8,314,561 B2
(45) Date of Patent: Nov. 20, 2012

(54) MULTI-CHANNEL RADIO FREQUENCY GENERATOR

(75) Inventors: Larry J. Fisk, West Henrietta, NY (US); Adrian Sapio, Rochester, NY (US)

(73) Assignee: MKS Instruments, Inc., Andover, MA (US)

( * ) Notice: Subject to any disclaimer, the term of this patent is extended or adjusted under 35 U.S.C. 154(b) by 45 days.

(21) Appl. No.: 12/760,771

(22) Filed: Apr. 15, 2010

(65) Prior Publication Data

US 2011/0241773 A1 Oct. 6, 2011

Related U.S. Application Data

(60) Provisional application No. 61/320,450, filed on Apr. 2, 2010.

(51) Int. Cl.
*H05B 31/26* (2006.01)
*H01J 7/24* (2006.01)

(52) U.S. Cl. ............... 315/111.21; 118/723 R; 330/127

(58) Field of Classification Search ............ 315/111.21, 315/160, 161, 167, 291, 294, 297, 299, 301, 315/307, 308; 330/207 R, 127, 138, 297; 118/723 R, 723; 313/231.31; 701/60, 57, 701/107, 182, 183, 189, 198, 199; 438/5
See application file for complete search history.

(56) References Cited

U.S. PATENT DOCUMENTS

| 5,155,547 | A | 10/1992 | Casper et al. |
| 6,020,794 | A * | 2/2000 | Wilbur ..................... 333/17.1 |
| 2006/0220573 | A1* | 10/2006 | Kotani et al. ............ 315/111.21 |
| 2006/0232471 | A1* | 10/2006 | Coumou ..................... 342/450 |
| 2007/0024362 | A1* | 2/2007 | Radomski et al. ............ 330/123 |
| 2008/0270048 | A1 | 10/2008 | van Zyl |

FOREIGN PATENT DOCUMENTS

| EP | 1750366 A2 | 2/2007 |
| EP | 1995759 A2 | 11/2008 |
| WO | 2009006149 A1 | 1/2009 |

OTHER PUBLICATIONS

International Search Report dated Jul. 20, 2011 for International Application No. PCT/US2011/021447.

* cited by examiner

*Primary Examiner* — Ryan Johnson
(74) *Attorney, Agent, or Firm* — Harness, Dickey & Pierce, P.L.C.

(57) ABSTRACT

A multi-channel radio frequency (RF) generator module includes N power amplifiers, M drivers, a power supply module, and a control module. The N power amplifiers generate N RF outputs, respectively. The M drivers drive the N power amplifiers based on M driver control signals, respectively. The power supply module receives alternating current (AC) input power and applies L rail voltages to the N power amplifiers based on L rail voltage setpoints, respectively. The control module sets the L rail voltage setpoints and the M driver control signals. N is an integer greater than one, L and M are integers greater than zero, and M and L are less than or equal to N.

28 Claims, 7 Drawing Sheets

MULTI-CHANNEL RADIO FREQUENCY GENERATOR

CROSS-REFERENCE TO RELATED APPLICATIONS

This application claims the benefit of U.S. Provisional Application No. 61/320,450, filed on Apr. 2, 2010. The disclosure of the above application is incorporated herein by reference in its entirety.

FIELD

The present disclosure relates to plasma chambers and to radio frequency (RF) generators.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

A radio frequency (RF) generator receives alternating current (AC) input power and generates an RF output. The RF output may be applied to, for example, a plasma electrode of a plasma chamber. In some circumstances, however, a plasma chamber may include a plurality of plasma electrodes. For example only, in plasma chambers used in solar panel fabrication, more than one plasma electrode may be needed as the surface area being treated is larger than one plasma electrode may be capable servicing. Exemplary systems may be referred to as multi-cathode, thin film deposition systems or multi-frequency, thin film etching and deposition systems.

Accordingly, more than one identical RF generators may be employed in some circumstances. Each of the RF generators generates an RF output and applies the RF output to one of the plasma electrodes. The RF generators may be electrically connected in an effort to generate identical RF outputs.

SUMMARY

A multi-channel radio frequency (RF) generator module includes N power amplifiers, M drivers, a power supply module, and a control module. The N power amplifiers generate N RF outputs, respectively. The M drivers drive the N power amplifiers based on M driver control signals, respectively. The power supply module receives alternating current (AC) input power and applies L rail voltages to the N power amplifiers based on L rail voltage setpoints, respectively. The control module sets the L rail voltage setpoints and the M driver control signals. N is an integer greater than one, L and M are integers greater than zero, and M and L are less than or equal to N.

In other features, a multi-channel radio frequency (RF) generator module includes N power amplifiers, M drivers, a power supply module, a parameter determination module, a feedback module, and a control module. The N power amplifiers generate N RF outputs, respectively. The M drivers drive the N power amplifiers based on M driver control signals, respectively. The power supply module receives alternating current (AC) input power and applies L rail voltages to the N power amplifiers based on L rail voltage setpoints, respectively. The parameter determination module determines N actual forward powers for the N RF outputs, respectively, and determines N reflection coefficients for the N RF outputs, respectively. The feedback module determines a total forward power of the multi-channel RF generator module based on the N actual forward powers and the N reflection coefficients. The control module controls the L rail voltage setpoints based on the total forward power. N is an integer greater than one, L and M are integers greater than zero, and M and L are less than or equal to N.

In still other features, a multi-channel radio frequency (RF) generator module includes: at least two power amplifiers that each generate an RF output; at least one driver that drives the power amplifiers based on at least one driver control signal; a power supply module that receives alternating current (AC) input power and that applies at least one rail voltage to the power amplifiers based on at least one rail voltage setpoint; and a control module that sets the at least one rail voltage setpoint and that sets the at least one driver control signal.

In other features, a multi-channel radio frequency (RF) generator includes: at least two power amplifier means, each for generating an RF output; at least one driver means for driving the power amplifier means based on at least one driver signal; a power supply means for receiving alternating current (AC) input power and for applying at least one rail voltage to the power amplifier means based on at least one rail voltage setpoint; and a control means for setting the at least one rail voltage setpoint and for setting the at least one driver signal.

In still other features, the systems described above are implemented by a computer program executed by one or more processors. The computer program can reside on a tangible computer readable medium such as but not limited to memory, nonvolatile data storage, and/or other suitable tangible storage mediums.

Further areas of applicability of the present disclosure will become apparent from the detailed description provided hereinafter. It should be understood that the detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

DETAILED DESCRIPTION

The following description is merely exemplary in nature and is in no way intended to limit the disclosure, its application, or uses. For purposes of clarity, the same reference numbers will be used in the drawings to identify similar elements. As used herein, the phrase at least one of A, B, and C should be construed to mean a logical (A or B or C), using a non-exclusive logical or. It should be understood that steps within a method may be executed in different order without altering the principles of the present disclosure.

As used herein, the term module refers to an Application Specific Integrated Circuit (ASIC), an electronic circuit, a processor (shared, dedicated, or group) and memory that execute one or more software or firmware programs, a combinational logic circuit, and/or other suitable components that provide the described functionality.

Figure 1:
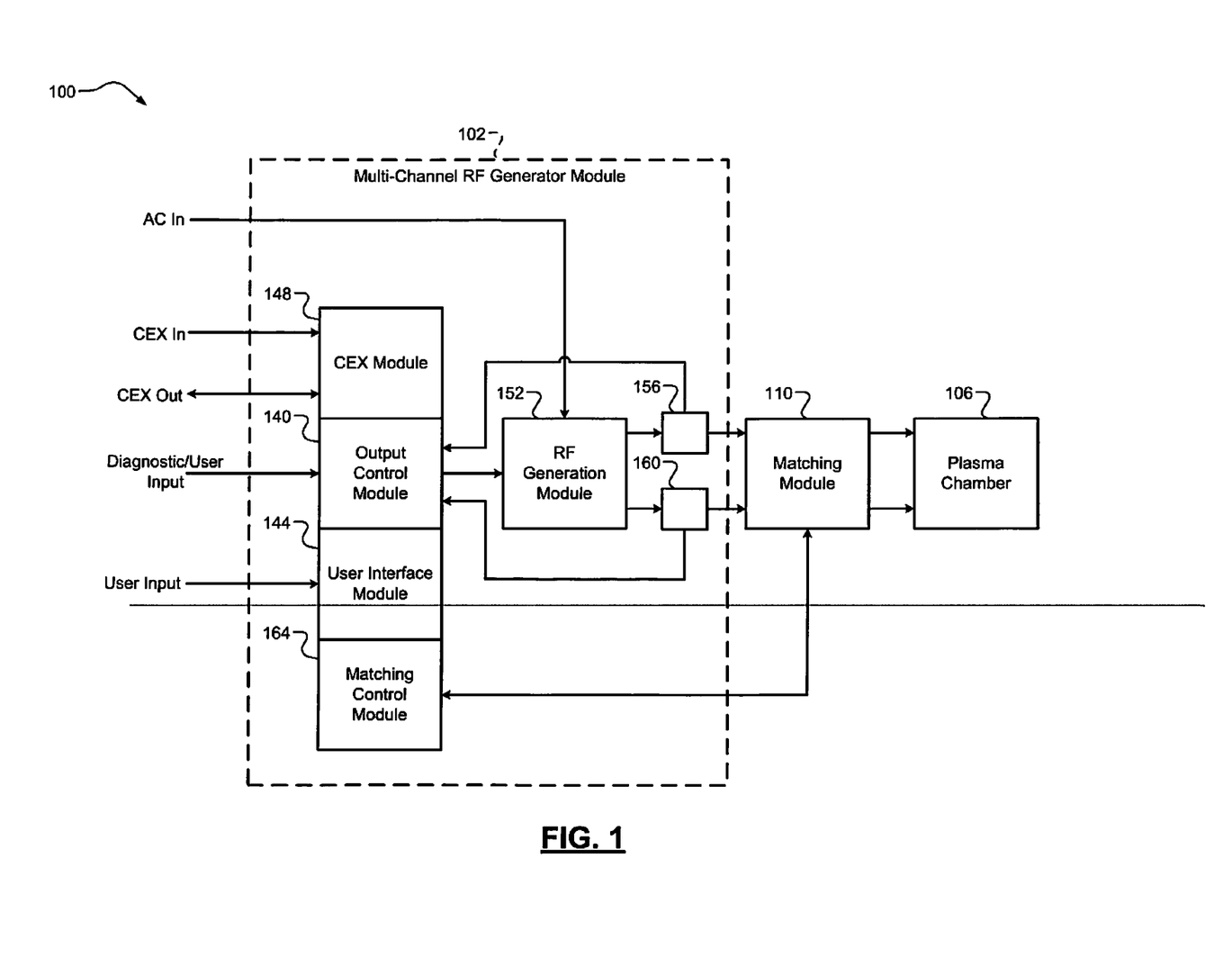
FIG. 1 is a functional block diagram of an exemplary multi-channel radio frequency (RF) plasma chamber system according to the principles of the present disclosure.

Referring now to FIG. 1, a functional block diagram of an exemplary implementation of an exemplary multi-channel, radio frequency (RF) plasma chamber system 100 is presented. While FIG. 1 illustrates a dual-channel RF plasma chamber system, the principles of the present disclosure apply to RF generator systems including two or more channels.

A multi-channel radio frequency (RF) generator module 102 receives alternating current (AC) input power and generates RF outputs using the AC input power. For example only, the AC input power may be three-phase AC power of approximately 480 Volts AC (VAC) or another suitable voltage. For purposes of discussion only, the multi-channel RF generator module 102 will be hereafter discussed as generating two RF outputs (i.e., being a dual-channel RF generator module). However, the multi-channel RF generator module 102 may generate a greater number of RF outputs. For example only, the multi-channel RF generator module 102 may generate one RF output per plasma electrode implemented in one or more plasma chambers, such as plasma chamber 106.

Generating multiple RF outputs using one multi-channel RF generator module, such as the multi-channel RF generator module 102, enables coordination of the RF outputs. More specifically, generating the multiple RF outputs using one multi-channel RF generator module may ensure that the RF outputs are approximately equal in frequency, phase, and/or magnitude.

As one RF generator normally generates one RF output, the number of components (i.e., parts) used in a system utilizing multiple RF outputs may be reduced using a multi-channel RF generator, such as the multi-channel RF generator module 102. Because system reliability generally decreases as the number of components increases, use of a multi-channel RF generator may increase reliability. Additionally, the cost of a multi-channel RF generator may be less than the cost of the number of single-channel RF generators necessary to produce the same number of RF outputs.

A matching module 110 receives the RF outputs and impedance matches each of the RF outputs before providing the RF outputs to the plasma chamber 106. The multi-channel RF generator module 102 may control the matching module 110. More specifically, the multi-channel RF generator module 102 may control the extent to which the matching module 110 performs impedance matching.

The matching module 110 applies the RF outputs to plasma electrodes (e.g., see FIGS. 2-5), respectively, implemented within the plasma chamber 106. Application of the RF outputs to the plasma electrodes may be performed, for example, in thin film deposition systems, thin film etching systems, and in other suitable. RF outputs may also be used in other suitable systems.

The multi-channel RF generator module 102 may include an output control module 140, a user interface module 144, a common excitation (CEX) module 148, and an RF generation module 152. The multi-channel RF generator module 102 may also include a first sensor module 156, a second sensor module 160, and a matching control module 164.

The output control module 140 receives an input power setpoint for the RF outputs that are generated by the RF generation module 152 (P Set) and that are delivered to the plasma electrodes. The input power setpoint may be provided by, for example, the user interface module 144 or another suitable source. Another suitable source of the input power setpoint may include, for example, a diagnostic or user input provided via a universal standard (US) 232 connection, via an ethernet connection, via a wireless connection, or via a front panel input. An external source (not shown) may input an RF signal (CEX In) that may be used by the output control module 140. The RF signal may also be output or made available for input or output by the CEX module 148 (CEX Out). For example only, the RF signal may be output to one or more other multi-channel RF generator modules that generate RF outputs for one or more other plasma chambers (not shown).

The first and second sensor modules 156 and 160 may measure voltage and current of the first RF and second RF outputs, respectively, generated by the RF generation module 152. The first and second sensor modules 156 and 160 may provide signals indicating the voltages and currents, respectively, to the output control module 140. For example only, the first and second sensor modules 156 and 160 may each include a RF coupler, a probe, or another suitable type of sensor. In other implementations, the first and second sensor modules 156 and 160 may output signals indicative of first and second forward and reverse powers associated with the first RF and second RF outputs, respectively. A forward power may refer to an amount of power delivered. A reverse power may refer to an amount of power reflected. The outputs of the first and second sensor modules 156 and 160 may be referred to as feedback signals. The feedback signals may be digital signals or analog signals.

Based on one or more of the feedback signals from the first sensor module 156, the output control module 140 may determine a first forward power for the first RF output. The output control module 140 may determine a second forward power for the second RF output based on one or more of the feedback signals from the second sensor module 160. The output control module 140 may also determine first and second reflection coefficients based on one or more of the feedback signals output by the first and second sensor modules 156 and 160, respectively.

The output control module 140 controls the generation of the first and second RF outputs using a feedback approach based on the first and second forward powers and the first and second reflection coefficients, respectively. More specifically, the output control module 140 provides one or more rail voltage setpoints and/or one or more driver control signals to the RF generation module 152. The RF generation module 152 controls one or more rail voltages (i.e., voltages input to power amplifiers) based on the rail voltage setpoint(s) and controls driving of power amplifiers based on the driver control signal(s).

Figure 2:
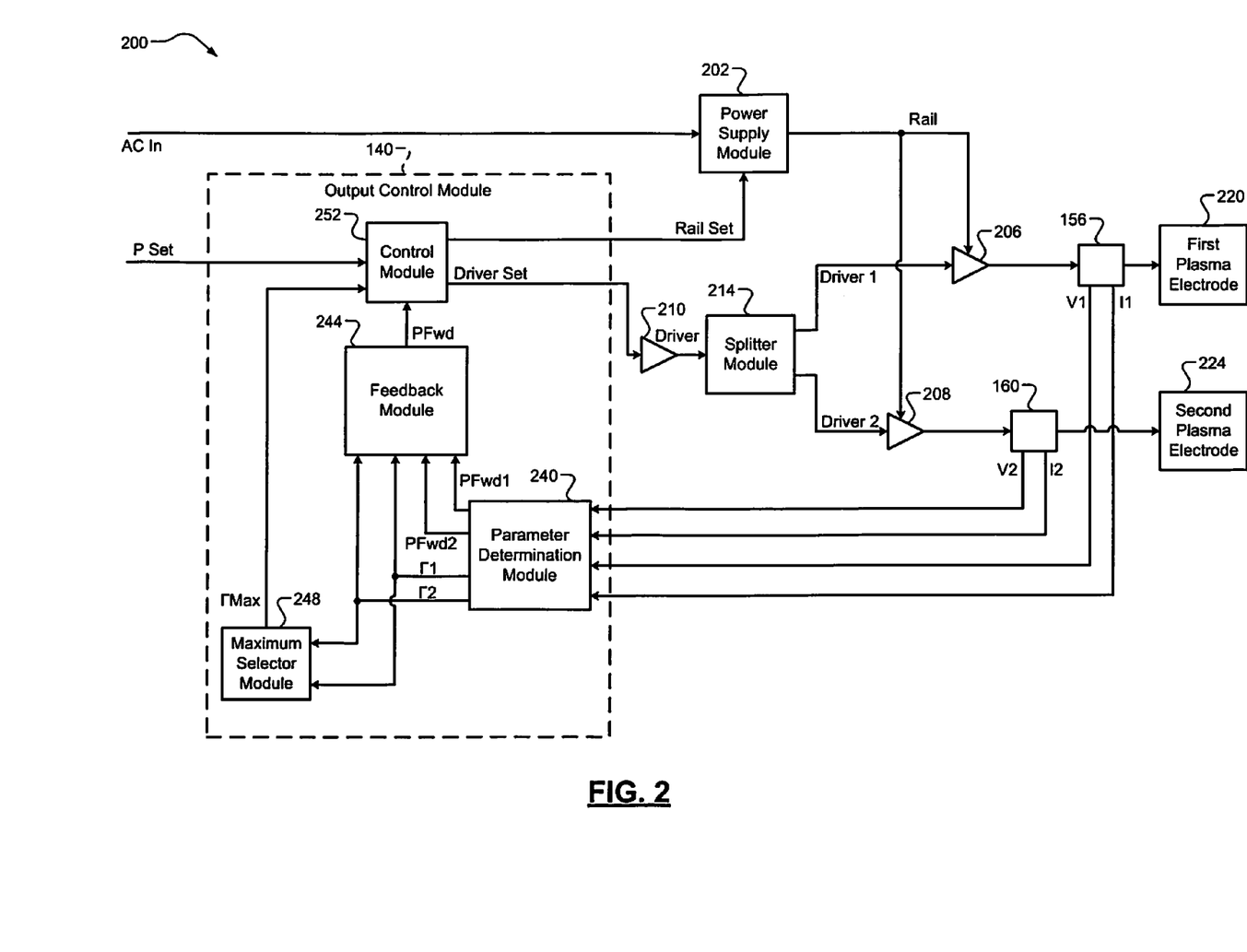
FIG. 2 is a functional block diagram of an exemplary single drive, single rail, dual channel RF generator system according to the principles of the present disclosure.

Referring now to FIG. 2, a functional block diagram of an exemplary single rail, single drive, dual-channel RF generator system 200 is presented. A power supply module 202 receives the AC input power. The power supply module 202 regulates a rail voltage (Rail) input to first and second power amplifiers 206 and 208 based on a rail voltage setpoint (Rail Set). For purposes of the present disclosure, a rail voltage may refer to the voltage input to a given power amplifier.

A splitter module 214 receives a driver signal (Driver) and splits the driver signal into first and second driver signals (Driver 1 and Driver 2). A driver 210 provides the driver signal to the splitter module 214. The driver 210 may also include a pre-amplifier. The splitter module 214 provides the first and second driver signals to the first and second power amplifiers 206 and 208, respectively.

The first and second driver signals drive the first and second power amplifiers 206 and 208 based on the first and second driver signals, respectively. The first and second power amplifiers 206 and 208 each generate an RF output based on the driver signal and the rail voltage provided to it. For example only, in the exemplary embodiment of FIG. 2, the first power amplifier 206 generates a first RF output based on the first driver signal and the rail voltage, and the second power amplifier 208 generates a second RF output based on the second driver signal and the rail voltage.

The first sensor module 156 may measure the voltage and current of the first RF output (V1 and I1) and provides the measurements to the output control module 140. The second sensor module 160 may measure the voltage and current of the second RF output (V2 and I2) and provides the measurements to the output control module 140. The first and second RF outputs are provided to first and second plasma electrodes 220 and 224, respectively, of the plasma chamber 106. The first and second RF outputs may be provided to the matching module 110 of FIG. 1 before being provided to the first and second plasma electrodes 220 and 224.

The output control module 140 may include a parameter determination module 240, a feedback module 244, a maximum selector module 248, and a control module 252. While not shown, the parameter determination module 240 may include an analog-to-digital (A/D) converter, a multiplexer, and a determination module. While not shown, the A/D converter and the multiplexer may be alternatively be implemented externally to the parameter determination module 240.

The A/D converter may convert the feedback signals provided by the first and second sensor modules 156 and 160 into digital values corresponding to the measured parameters, respectively. The A/D converter may be omitted in implementations where the feedback signals are digital signals. The multiplexer may select a channel associated with the measurements of one of the first and second sensor modules 156 and 160 and process or store the digital values. The multiplexer may select a channel associated with the other one of the first and second sensor modules 156 and 160 and process or store those digital values. The multiplexer may continue this process until the values of all of the channels have been processed or stored. For example only, the multiplexer may include a time-division multiplexer (TDM), a frequency-division multiplexer (FDM), or another suitable multiplexer.

The parameter determination module 240 determines a first reflection coefficient ($\Gamma 1$) for the first RF output. The parameter determination module 240 determines a second reflection coefficient ($\Gamma 2$) for the second RF output. The parameter determination module 240 may determine the first and second reflection coefficients based on one or more of the feedback signals from the first and second sensor modules 156 and 160, respectively. The parameter determination module 240 also determines a first forward power of the first RF output (PFwd 1) and determines a second forward power the second RF output (PFwd 2). The first and second forward powers may also be referred to as first and second delivered powers, respectively. In various implementations, the parameter determination module 240 may also determine a reflected or reverse power for each of the first and second RF outputs.

The feedback module 244 determines a total forward power (PFwd) based on the first and second forward powers.

As an example only, the feedback module 244 may determine the total forward power using the relationship:

$$PFwd = f(PFwd_1, \Gamma_1, PFwd_2, \Gamma_2, \ldots, PFwd_N, \Gamma_N),$$

where PFwd is the total forward power, $PFwd_N$ is the power forward by an N-th one of the RF outputs, $\Gamma_N$ is the reflection coefficient determined for the N-th one of the RF outputs, and N is an integer greater than one.

As another example only, the feedback module 244 may determine the total forward power based on an average of the first and second forward powers. For example only, the feedback module 244 may determine the total forward power using the equation:

$$PFwd = \frac{PFwd_1 + PFwd_2}{2},$$

for a system having 2 RF outputs.

As another example only, the feedback module 244 may determine the total forward power using the relationship:

$$PFwd = \begin{cases} PFwd_1 & \text{if } |\Gamma 1| \geq |\Gamma 2|; \text{ and} \\ PFwd_2 & \text{if } |\Gamma 1| < |\Gamma 2| \end{cases}.$$

As another example only, the feedback module 244 may determine the total forward power using the equation:

$$PFwd = \left[\frac{1 + (|\Gamma 1| - |\Gamma 2|)}{2}\right] * PFwd_1 + \left[\frac{1 + (|\Gamma 2| - |\Gamma 1|)}{2}\right] * PFwd_2,$$

for a system having 2 RF outputs.

As another example only, the feedback module 244 may determine the total forward power using the equation:

$$PFwd = \frac{(PFwd_1 + PFwd_2) * e^{-5*(|\Gamma 1| - |\Gamma 2|)}}{1 + e^{-5*(|\Gamma 1| - |\Gamma 2|)}},$$

for a system having 2 RF outputs.

The maximum selector module 248 receives the first and second reflection coefficients. The maximum selector module 248 compares the first and second reflection coefficients and determines a greater one of the first and second reflection coefficients. The maximum selector module 248 outputs the greater one of the first and second reflection coefficients as a maximum reflection coefficient ($\Gamma$Max). This may better direct the output control module 140 to react to the channel having the higher reflection coefficient.

The control module 252 determines the rail voltage setpoint and generates a driver control signal (Driver Set). The control module 252 may generate the driver control signal based on the maximum reflection coefficient (see FIG. 6, solid lines). The control module 252 may generate first and second driver control signals based on the first and second reflection coefficients and combine the first and second driver signals into the driver control signal (see FIG. 6, dashed lines). The driver 210 generates the driver signal based on the driver control signal.

The control module 252 determines a forward power setpoint based on the input power setpoint (P Set) and the maximum reflection coefficient. The control module 252 determines an error based on a difference between the forward power setpoint and the forward power (PFwd). The control module 252 determines the rail voltage setpoint (Rail Set) based on the error.

Figure 3:
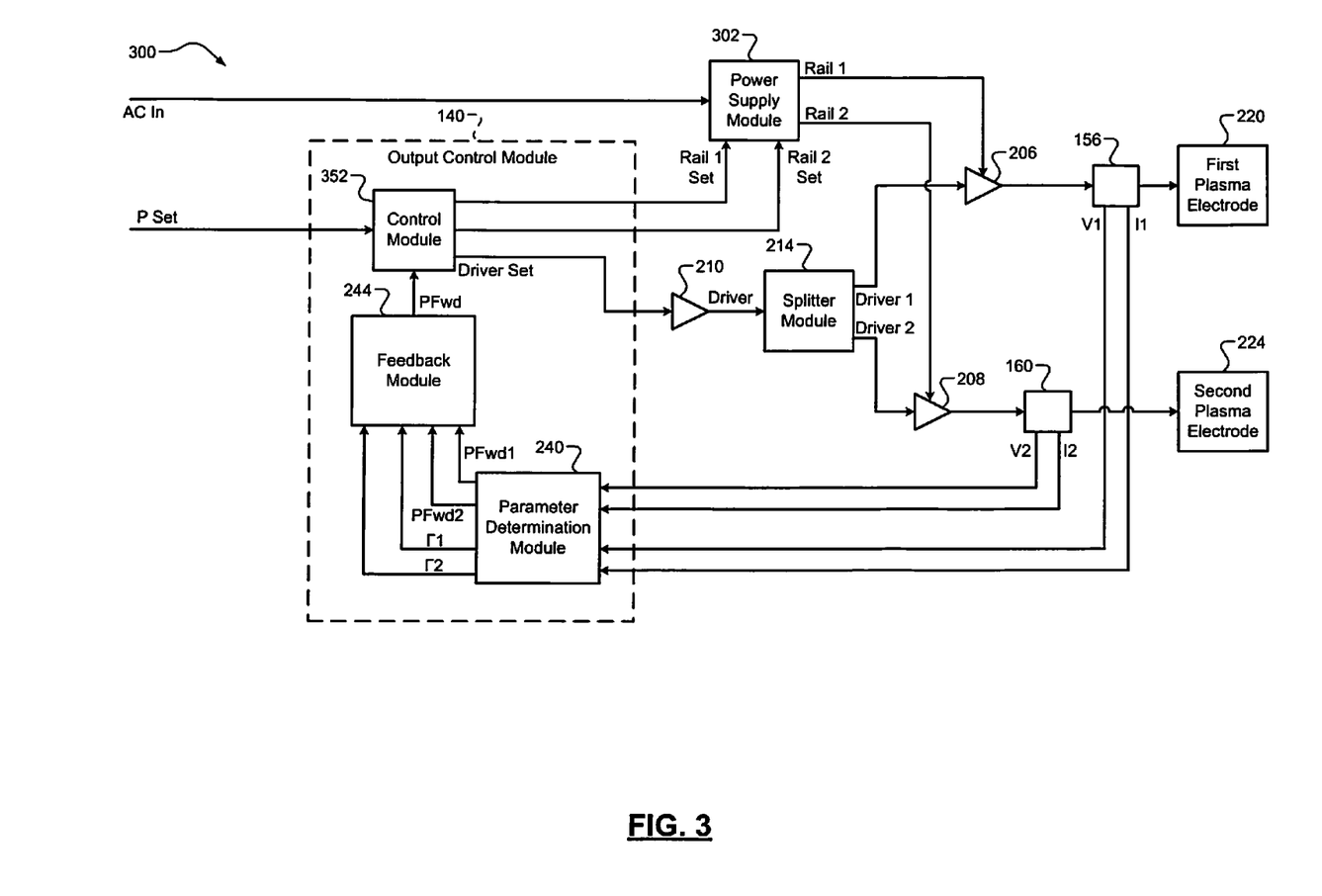
FIG. 3 is a functional block diagram of an exemplary single drive, dual rail, dual channel RF generator system according to the principles of the present disclosure.

Referring now to FIG. 3, a functional block diagram of an exemplary dual rail, single drive, dual-channel RF generator system 300 is presented. A power supply module 302 receives the AC input power. The power supply module 302 regulates first and second rail voltages (Rail 1 and Rail 2) input to the first and second power amplifiers 206 and 208 based on first and second rail voltage setpoints (Rail 1 Set and Rail 2 Set), respectively.

A control module 352 provides the driver control signal (Driver Set) to the driver 210 and provides the first and second rail voltage setpoints to the power supply module 302. The control module 352 of FIG. 3 may generate the driver control signal similarly or identically to the control module 252 of FIG. 2. The control module 352 (see FIG. 7) determines first and second forward power setpoints for the first and second RF outputs based on the first and second reflection coefficients, respectively. The control module 352 determines the first and second forward power setpoints further based on the power setpoint (PFwd).

The control module 352 determines a first error for the first RF output based on a difference between the first forward power setpoint and the first forward power. The control module 352 determines a second error for the second RF output based on a difference between the second forward power setpoint and the second forward power. The control module 352 determines the first and second rail voltage setpoints based on the first and second errors, respectively.

Figure 4:
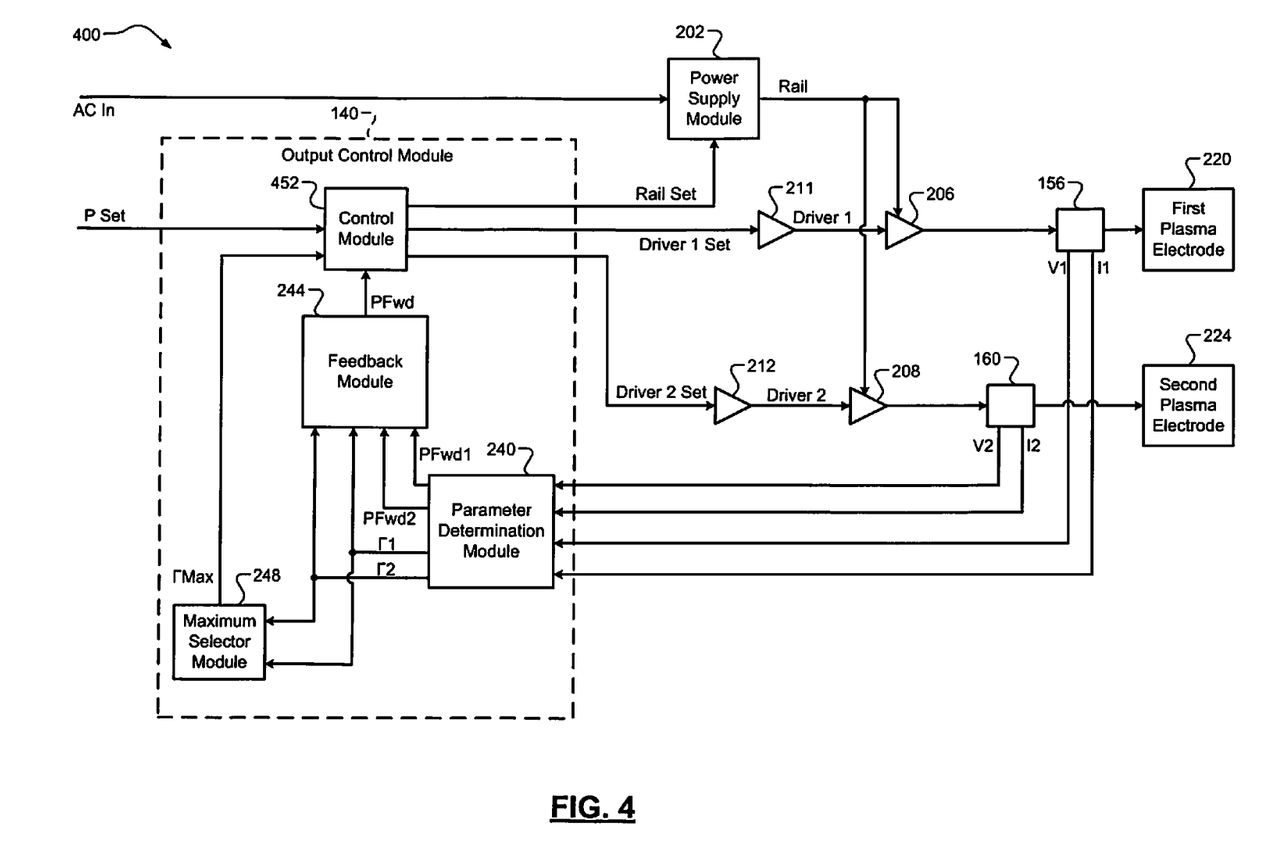
FIG. 4 is a functional block diagram of an exemplary dual drive, single rail, dual channel RF generator system according to the principles of the present disclosure.

Referring now to FIG. 4, a functional block diagram of an exemplary single rail, dual drive, dual-channel RF generator system 400 is presented. The first and second power amplifiers 206 and 208 each generate an RF output based on the driver signal and the rail voltage provided to it. For example only, in the exemplary embodiment of FIG. 4, the first power amplifier 206 generates a first RF output based on a first driver signal (Driver 1) and the rail voltage, and the second power amplifier 208 generates a second RF output based on a second driver signal (Driver 2) and the rail voltage.

A control module 452 provides the rail voltage setpoint (Rail Set) to the power supply module 202. The control module 452 provides first and second driver control signals (Driver 1 Set and Driver 2 Set) to first and second drivers 211 and 212, respectively. The control module 452 may determine the rail voltage setpoint similarly or identically to the control module 252 of FIG. 2. The control module 452 generates the first and second driver control signals based on the first and second reflection coefficients, respectively.

Figure 5:
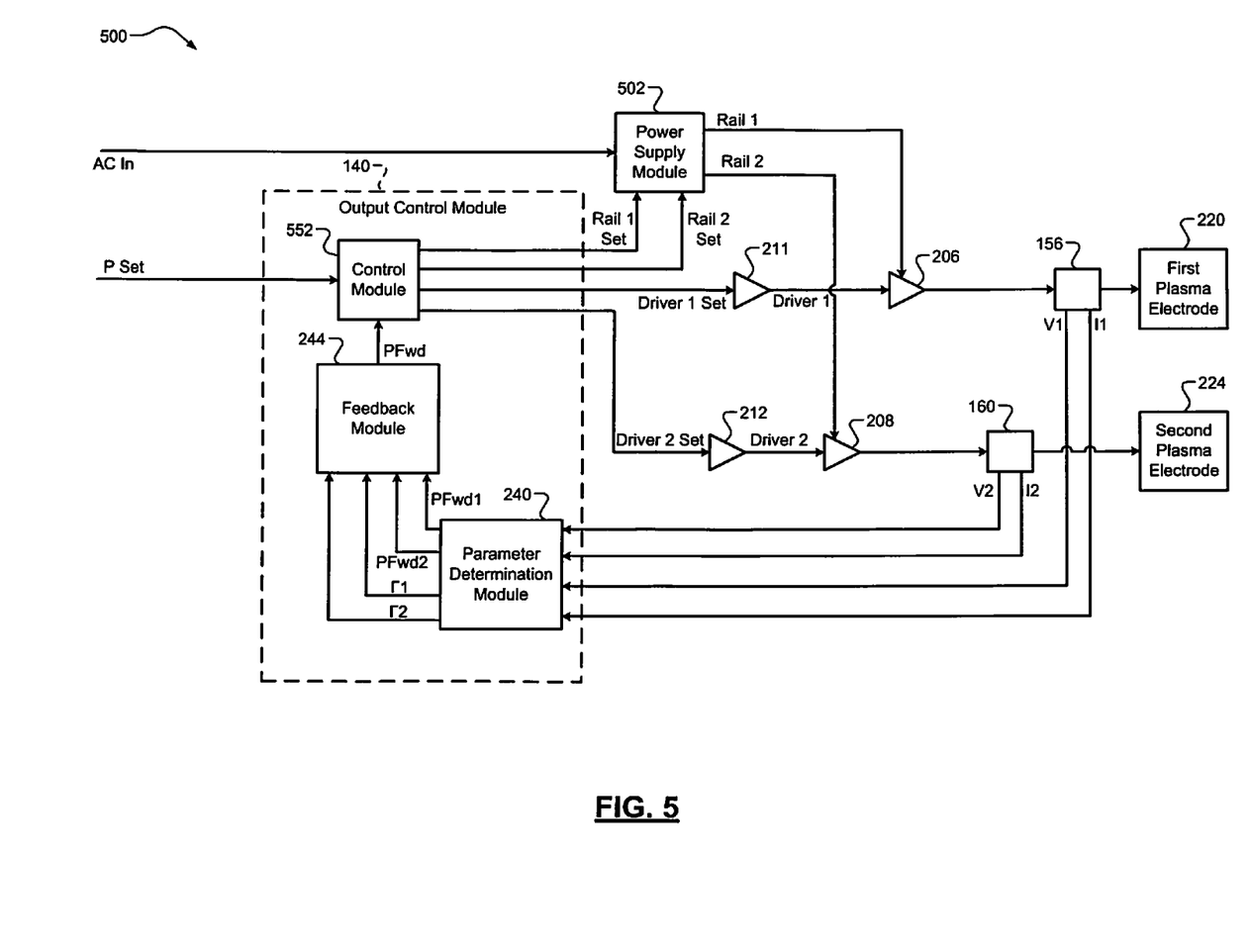
FIG. 5 is a functional block diagram of an exemplary dual drive, dual rail, dual channel RF generator system according to the principles of the present disclosure.

Referring now to FIG. 5, a functional block diagram of an exemplary dual rail, dual drive, dual-channel RF generator system 500 is presented. A power supply module 502 receives the AC input power. The power supply module 502 regulates first and second rail voltages (Rail 1 and Rail 2) input to the first and second power amplifiers 206 and 208 based on first and second rail voltage setpoints (Rail 1 Set and Rail 2 Set).

The first and second power amplifiers 206 and 208 each generate an RF output based on the driver control signal and the rail voltage provided to it. For example only, in the exemplary embodiment of FIG. 5, the first power amplifier 206 generates a first RF output based on a first driver signal (Driver 1) and the first rail voltage, and the second power amplifier 208 generates a second RF output based on a second driver signal (Driver 2) and the second rail voltage.

A control module 552 provides the first and second driver control signals (Driver 1 Set and Driver 2 Set) to the first and second drivers 211 and 212, respectively. The first and second drivers 211 and 212 generate the first and second driver signals based on the first and second driver control signals, respectively. The control module 552 also provides the first and second rail voltage setpoints to the power supply module 502. The control module 552 may determine the first and second rail voltage setpoints similarly or identically to the control module 352 of FIG. 3. The control module 552 may determine the first and second driver control signals similarly or identically to the control module 452 of FIG. 4.

Figure 6:
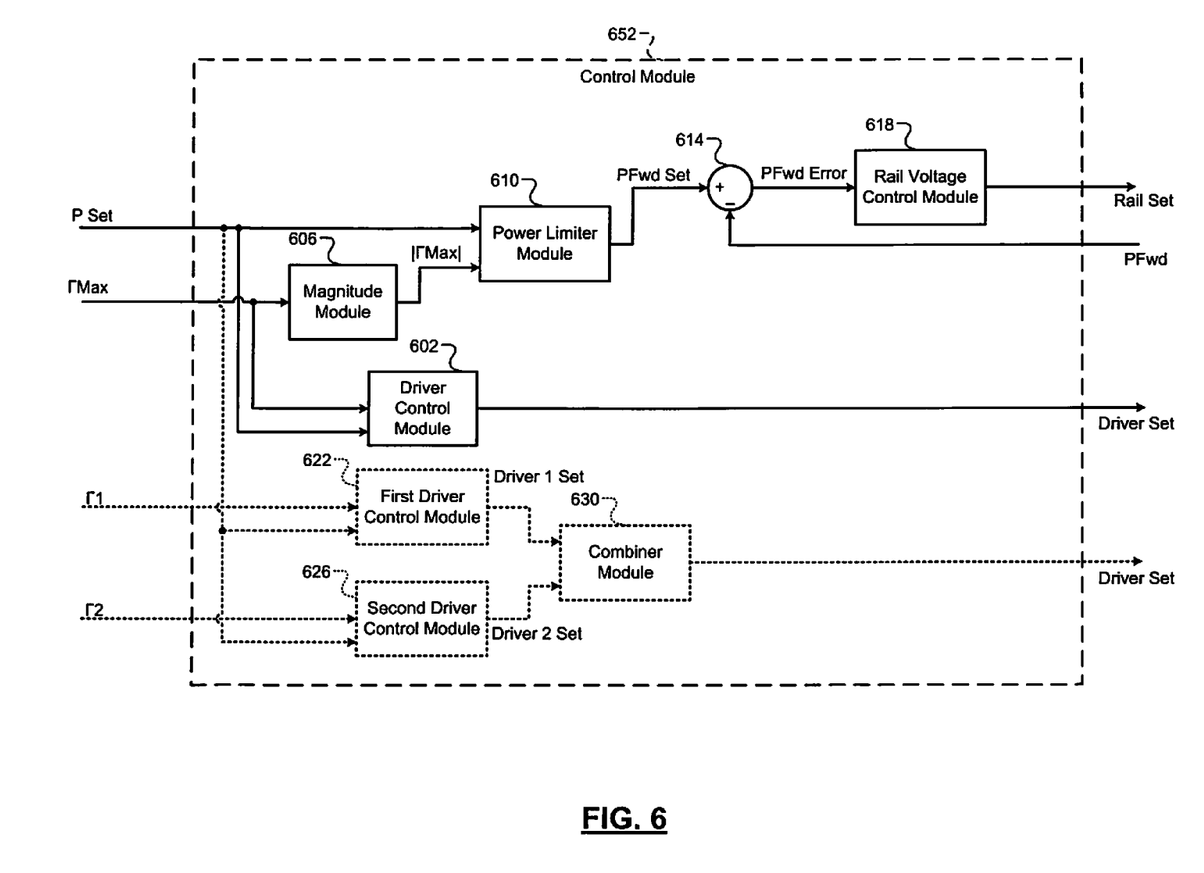
FIGS. 6 and 7 are functional block diagrams of exemplary control modules according to the principles of the present disclosure.

Referring now to FIG. 6, a functional block diagram of an exemplary control module 652 is presented. The control module 252 of FIG. 2 and the control module 452 of FIG. 4 may be similar or identical or may perform similarly or identically to the control module 652. The control module 652 may control a single rail and/or a single drive, multi-channel RF generation system. In single rail, dual drive, multi-channel RF generation systems or in dual rail, single drive, multi-channel RF generation systems, portions of the control module 652 may be incorporated with portions of a control module 752, which is discussed below in conjunction with the exemplary embodiment of FIG. 7. The control module 652 may include a driver control module 602, a magnitude module 606, a power limiter module 610, an error module 614, and a rail voltage control module 618.

The driver control module 602 generates the driver control signal (Driver Set) based on the maximum reflection coefficient and the input power setpoint. In other implementations, the driver control module 602 may generate the driver control signal based on the maximum reflection coefficient and the rail voltage setpoint. The driver control signal may be provided to a driver or a driver/pre-amplifier, such as the driver 210. The driver generates a driver signal based on the driver control signal. A splitter, such as the splitter module 214, splits the driver signal into first and second driver signals and provides the first and second driver signals to first and second power amplifiers, such as the first and second power amplifiers 206 and 208.

The magnitude module 606 may determine a magnitude (i.e., absolute value) of the maximum reflection coefficient ($|\Gamma Max|$). The power limiter module 610 determines the forward power setpoint (PFwd Set) based on the input power setpoint and the magnitude of the maximum reflection coefficient. In other implementations, the magnitude module 606 may be omitted, and the power limiter module 610 may determine the forward power setpoint based on the maximum reflection coefficient (in the complex form) and the input power setpoint.

The error module 614 determines a forward power error (PFwd Error) based on the forward power setpoint and the forward power (PFwd). More specifically, the error module 614 determines the forward power error based on a difference between the forward power setpoint and the forward power. The forward power may be provided by the feedback module 244.

The rail voltage control module 618 determines the rail voltage setpoint (Rail Set) based on the forward power error. For example only, the rail voltage control module 618 may determine the rail voltage setpoint based on a function or a mapping that relates the forward power error to the rail voltage setpoint.

In another various implementation, the control module 652 may include a first driver control module 622, a second driver control module 626, and a combiner module 630. The first driver control module 622 may determine a first driver control signal (Driver 1 Set) based on the first reflection coefficient and the input power setpoint. The second driver control module 626 may determine a second driver control signal (Driver 2 Set) based on the second reflection coefficient and the input power setpoint. In other implementations, the first and second driver control modules 622 and 626 may determine the first and second driver control signals based on the first and second reflection coefficients, respectively, and the rail voltage setpoint.

The combiner module 630 may determine the driver control signal (Driver Set) based on the first driver control signal and/or the second driver control signal. For example only, the combiner module 630 may set the driver control signal to the lesser one of the first and second driver control signals, determine the driver control signal based on a variable linear combination of the first and second driver control signals, or determine the driver control signal in another suitable manner.

Figure 7:
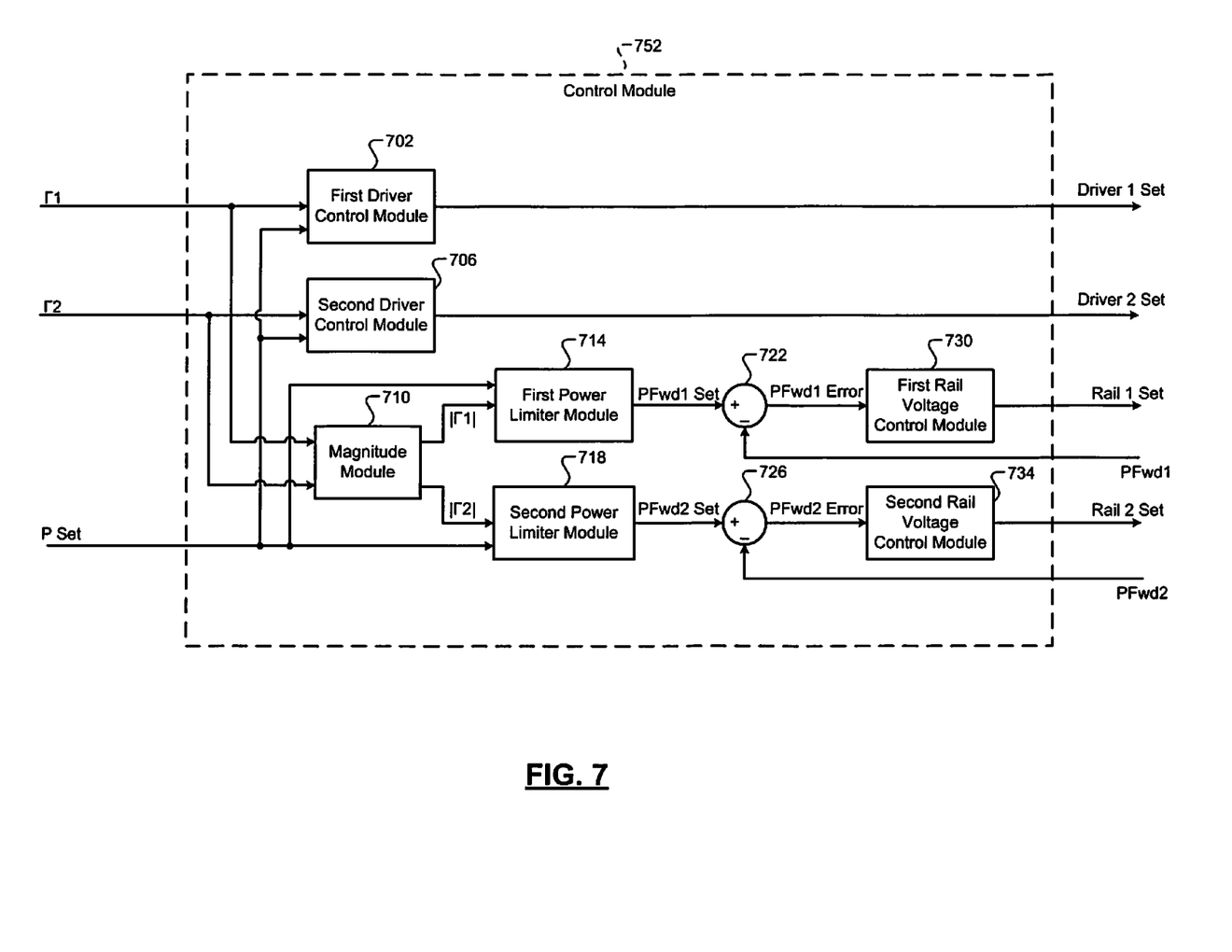

Referring now to FIG. 7, a functional block diagram of an exemplary implementation of the control module 752 is presented. The control module 352 of FIG. 3 and the control module 552 of FIG. 5 may be similar or identical to the control module 752. The control module 752 may control a dual rail and/or a dual drive, multi-channel RF generation system.

The control module 752 may include first and second driver control modules 702 and 706, a magnitude module 710, first and second power limiter modules 714 and 718, first and second error modules 722 and 726, and first and second rail voltage control modules 730 and 734. The first and second driver control modules 702 and 706 may determine first and second driver control signals (Driver 1 Set and Driver 2 Set) based on the first and second reflection coefficients, respectively, and the input power setpoint. The first and second driver control signals may be provided to first and second drivers, such as the first and second drivers 211 and 212. The first and second drivers generate driver signals based on the first and second driver control signals and provide the first and second driver signals to first and second power amplifiers, such as the first and second power amplifiers 206 and 208.

The magnitude module 710 may determine magnitudes of the first and second reflection coefficients ($|\Gamma 1|$ and $|\Gamma 2|$). The first and second power limiter modules 714 and 718 determine the first and second forward power setpoints (PFwd1 Set and PFwd2 Set) based on the magnitudes of the first and second reflection coefficients, respectively. The first and second power limiter modules 714 and 718 determine the first and second forward power setpoints further based on the input power setpoint. In other implementations, the magnitude module 710 may be omitted, and the first and second power limiter modules 714 and 718 may determine the first and second forward power setpoints based on the first and second reflection coefficients (in their complex forms), respectively.

The first and second error modules 722 and 726 determine first and second forward power errors (PFwd1 Error and PFwd2 Error) based on the first and second forward power setpoints and the first and second forward powers (PFwd1 and PFwd2), respectively. More specifically, the first and second error modules 722 and 726 determine the first and second forward power error based on differences between the first and second forward power setpoints and the first and second forward powers, respectively. The forward powers may be provided by the parameter determination module 240.

The first and second rail voltage control modules 730 and 734 determine first and second rail voltage setpoints (Rail1 Set and Rail2 Set) based on the first and second forward power errors, respectively. For example only, the first and second rail voltage control modules 730 and 734 may determine the first and second rail voltage setpoints based on functions or mappings that relate the first and second forward power errors to the first and second rail voltage setpoints, respectively.

The broad teachings of the disclosure can be implemented in a variety of forms. Therefore, while this disclosure includes particular examples, the true scope of the disclosure should not be so limited since other modifications will become apparent to the skilled practitioner upon a study of the drawings, the specification, and the following claims.

What is claimed is:

1. A multi-channel radio frequency (RF) generator module comprising:
   N power amplifiers that generate N RF outputs, respectively;
   M drivers that drive the N power amplifiers based on M driver control signals, respectively;
   a power supply module that receives alternating current (AC) input power and that applies L rail voltages to the N power amplifiers based on L rail voltage setpoints, respectively;
   a control module that sets the L rail voltage setpoints and the M driver control signals,
   wherein the N RF outputs are provided to N respective plasma electrodes of a plasma chamber, and
   wherein N is an integer greater than one, L and M are integers greater than zero, and M and L are less than or equal to N;
   a parameter determination module that determines N actual forward powers for the N RF outputs, respectively; and
   a feedback module that determines a total forward power of the multi-channel RF generator module based on the N actual forward powers,
   wherein the control module sets the L rail voltage setpoints based on the total forward power.

2. The multi-channel RF generator module of claim 1 wherein L, M, and N are equal to two.

3. The multi-channel RF generator module of claim 1 wherein one of L and M is equal to two and the other of L and M is equal to one.

4. The multi-channel RF generator module of claim 1 wherein the parameter determination module determines N reflection coefficients for the N RF outputs, respectively,
   wherein the control module determines the M driver control signals based on the N reflection coefficients, respectively, and
   wherein M is equal to N.

5. A multi-channel radio frequency (RF) generator module comprising:
   N power amplifiers that generate N RF outputs, respectively;
   M drivers that drive the N power amplifiers based on M driver control signals, respectively;
   a power supply module that receives alternating current (AC) input power and that applies L rail voltages to the N power amplifiers based on L rail voltage setpoints, respectively;
   a control module that sets the L rail voltage setpoints and the M driver control signals;
   a parameter determination module that determines N reflection coefficients for the N RF outputs, respectively; and
   a splitter module,
   wherein the control module determines one driver control signal based on a greatest one of the N reflection coefficients, wherein M is equal to one and the one driver generates one driver signal based on the one driver control signal, and wherein the splitter module splits the one driver signal into N driver signals and drives the N power amplifiers based on the N driver signals, respectively, wherein N is an integer greater than one, L is an integer greater than zero, and L is less than or equal to N.

6. The multi-channel RF generator module of claim 1 wherein:

the parameter determination module determines N actual forward powers and N reflection coefficients for the N RF outputs, respectively, wherein the control module sets the L rail voltage setpoints based on the N actual forward powers, respectively, and wherein L is equal to N.

7. The multi-channel RF generator module of claim 1 wherein the parameter determination module further determines N reflection coefficients for the N RF outputs, respectively, and wherein the feedback module determines the total forward power based on a function of the N actual forward powers and the N reflection coefficients.

8. The multi-channel RF generator module of claim 1 wherein the feedback module sets the total forward power equal to an average of the N actual forward powers.

9. The multi-channel RF generator module of claim 1 wherein the parameter determination module further determines N reflection coefficients for the N RF outputs, respectively, and wherein the feedback module sets the total forward power equal to one of the N actual forward powers associated with one of the N RF outputs when a first magnitude of the reflection coefficient of the one of the N RF outputs is greater than a second magnitude of a reflection coefficient of another one of the N RF outputs.

10. The multi-channel RF generator module of claim 1 wherein the parameter determination module further determines N reflection coefficients for the N RF outputs, respectively, and wherein the feedback module sets the total forward power equal to:

$$= \left[\frac{1+(|\Gamma 1|-|\Gamma 2|)}{2}\right]*PFwd_1 + \left[\frac{1+(|\Gamma 2|-|\Gamma 1|)}{2}\right]*PFwd_2,$$

where N is equal to two, ΓN is an N-th one of the N reflection coefficients, and wherein PFwdN is an N-th one of the N actual forward powers.

11. The multi-channel RF generator module of claim 1 wherein the parameter determination module further determines N reflection coefficients for the N RF outputs, respectively, and wherein the feedback module sets the total forward power equal to:

$$= \frac{(PFwd_1 + PFwd_2)*e^{-5*(|\Gamma 1|-|\Gamma 2|)}}{1+e^{-5*(|\Gamma 1|-|\Gamma 2|)}},$$

where N is equal to two, ΓN is an N-th one of the N reflection coefficients, and wherein PFwdN is an N-th one of the N actual forward powers.

12. A multi-channel radio frequency (RF) generator module comprising:

N power amplifiers that generate N RF outputs, respectively;

M drivers that drive the N power amplifiers based on M driver control signals, respectively;

a power supply module that receives alternating current (AC) input power and that applies L rail voltages to the N power amplifiers based on L rail voltage setpoints, respectively;

a parameter determination module that determines N actual forward powers for the N RF outputs, respectively, and that determines N reflection coefficients for the N RF outputs, respectively;

a feedback module that determines a total forward power of the multi-channel RF generator module based on the N actual forward powers and the N reflection coefficients; and a control module that controls the L rail voltage setpoints based on the total forward power, wherein N is an integer greater than one, L and M are integers greater than zero, and M and L are less than or equal to N.

13. The multi-channel RF generator module of claim 12 wherein the feedback module sets the total forward power equal to an average of the N actual forward powers.

14. The multi-channel RF generator module of claim 12 wherein the feedback module sets the total forward power equal to one of the N actual forward powers associated with one of the N RF outputs when a first magnitude of the reflection coefficient of the one of the N RF outputs is greater than a second magnitude of a reflection coefficient of another one of the N RF outputs.

15. The multi-channel RF generator module of claim 12 wherein the feedback module sets the total forward power equal to:

$$= \left[\frac{1+(|\Gamma 1|-|\Gamma 2|)}{2}\right]*PFwd_1 + \left[\frac{1+(|\Gamma 2|-|\Gamma 1|)}{2}\right]*PFwd_2,$$

where N is equal to two, ΓN is an N-th one of the N reflection coefficients, and wherein PFwdN is an N-th one of the N actual forward powers.

16. The multi-channel RF generator module of claim 12 wherein the feedback module sets the total forward power equal to:

$$= \frac{(PFwd_1 + PFwd_2)*e^{-5*(|\Gamma 1|-|\Gamma 2|)}}{1+e^{-5*(|\Gamma 1|-|\Gamma 2|)}},$$

where N is equal to two, ΓN is an N-th one of the N reflection coefficients, and wherein PFwdN is an N-th one of the N actual forward powers.

17. The multi-channel RF generator module of claim 12 wherein L and M are equal to two.

18. The multi-channel RF generator module of claim 12 wherein one of L and M is equal to two and the other of L and M is equal to one.

19. The multi-channel RF generator module of claim 12 further comprising a splitter module, wherein the control module generates one driver control signal based on a greatest one of the N reflection coefficients, wherein M is equal to one and the one driver generates one driver signal based on the one driver control signal, and wherein the splitter module splits the one driver signal into N driver signals and drives the N power amplifiers based on the N driver signals, respectively.

20. A multi-channel radio frequency (RF) generator module comprising:
at least two power amplifiers that each generate an RF output;
at least one driver that drives the power amplifiers based on at least one driver control signal;
a power supply module that receives alternating current (AC) input power and that applies at least one rail voltage to the power amplifiers based on at least one rail voltage setpoint; and
a control module that sets the at least one rail voltage setpoint and that sets the at least one driver control signal,
wherein each of the RF outputs are provided to at least two respective plasma electrodes of a plasma chamber;
a parameter determination module that determines at least two reflection coefficients for the RF outputs of the at least two power amplifiers, respectively; and
a splitter module,
wherein the control module determines only one driver control signal based on a greatest one of the reflection coefficients,
wherein the at least one driver includes only one driver, and the driver generates one driver signal based on the one driver control signal, and
wherein the splitter module splits the one driver signal into at least two driver signals and drives the at least two power amplifiers based on the at least two driver signals, respectively.

21. The multi-channel RF generator module of claim 20 wherein the at least two power amplifiers includes two power amplifiers, the at least one driver includes two drivers, and the at least one rail voltage includes two rail voltages.

22. The multi-channel RF generator module of claim 20 wherein the parameter determination module determines at least two reflection coefficients for the RF outputs of the at least two power amplifiers, respectively, and
wherein the control module sets the at least one driver control signal based on the reflection coefficients.

23. The multi-channel RF generator module of claim 20 wherein:
the parameter determination module determines at least two actual forward powers and at least two reflection coefficients for the RF outputs of the at least two power amplifiers, respectively,
wherein the control module sets the at least one rail voltage setpoints based on the actual forward powers.

24. A multi-channel radio frequency (RF) generator module comprising:
at least two power amplifiers that each generate an RF output;
at least one driver that drives the power amplifiers based on at least one driver control signal;
a power supply module that receives alternating current (AC) input power and that applies at least one rail voltage to the power amplifiers based on at least one rail voltage setpoint; and
a control module that sets the at least one rail voltage setpoint and that sets the at least one driver control signal;
a parameter determination module that determines at least two actual forward powers for the RF outputs of the at least two power amplifiers, respectively; and
a feedback module that determines a total forward power of the multi-channel RF generator module based on the at least two actual forward powers,
wherein each of the RF outputs are provided to at least two respective plasma electrodes of a plasma chamber;
wherein the control module sets the at least one rail voltage setpoint based on the total forward power.

25. A multi-channel radio frequency (RF) generator comprising:
at least two power amplifier means, each for generating an RF output;
at least one driver means for driving the power amplifier means based on at least one driver signal;
a power supply means for receiving alternating current (AC) input power and for applying at least one rail voltage to the power amplifier means based on at least one rail voltage setpoint; and
a control means for setting the at least one rail voltage setpoint and for setting the at least one driver signal;
wherein each of the RF outputs are provided to at least two respective plasma electrodes of a plasma chamber;
a determination means for determining at least two reflection coefficients for the RF outputs of the at least two power amplifiers, respectively; and
a splitter means,
wherein the control means is for determining only one driver control signal based on a greatest one of the reflection coefficients,
wherein the at least one driver means includes only one driver means for generating only one driver signal based on the one driver control signal, and
wherein the splitter means is for splitting the one driver signal into at least two driver signals and for driving the at least two power amplifiers based on the at least two driver signals, respectively.

26. The multi-channel RF generator of claim 25 wherein the at least two power amplifier means includes two power amplifier means, the at least one driver means includes two driver means, and the at least one rail voltage includes two rail voltages.

27. The multi-channel RF generator of claim 25 further wherein the determination means determines at least two reflection coefficients for the RF outputs of the at least two power amplifiers, respectively, and
wherein the control means is for setting the at least one driver control signal based on the reflection coefficients, respectively.

28. A multi-channel radio frequency RF generator comprising:
at least two power amplifier means, each for generating an RF output;
at least one driver means for driving the power amplifier means based on at least one driver signal;
a power supply means for receiving alternating current (AC) input power and for applying at least one rail voltage to the power amplifier means based on at least one rail voltage setpoint; and
a control means for setting the at least one rail voltage setpoint and for setting the at least one driver signal;
a determination means for determining at least two actual forward powers for the RF outputs of the at least two power amplifiers, respectively; and
a feedback means for determining a total forward power of the multi-channel RF generator based on the at least two actual forward powers,
wherein each of the RF outputs are provided to at least two respective plasma electrodes of a plasma chamber, and
wherein the control module is for setting the at least one rail voltage setpoint based on the total forward power.

* * * * *